United States Patent
Singh et al.

(10) Patent No.: US 6,780,219 B2
(45) Date of Patent: Aug. 24, 2004

(54) METHOD OF SPHERIDIZING SILICON METAL POWDERS

(75) Inventors: Raj P. Singh, Sayre, PA (US); David L. Houck, Towanda, PA (US); Nelson E. Kopatz, Sayre, PA (US); Michael R. Pierce, Towanda, PA (US); Scott A. Braymiller, Troy, PA (US)

(73) Assignee: Osram Sylvania Inc., Danvers, MA (US)

( * ) Notice: Subject to any disclaimer, the term of this patent is extended or adjusted under 35 U.S.C. 154(b) by 104 days.

(21) Appl. No.: 10/189,620

(22) Filed: Jul. 3, 2002

(65) Prior Publication Data

US 2004/0004301 A1 Jan. 8, 2004

(51) Int. Cl.[7] .................................................. B22F 1/00
(52) U.S. Cl. ......................................... 75/342; 264/15
(58) Field of Search ................................ 264/15; 75/342

(56) References Cited

U.S. PATENT DOCUMENTS

| | | | |
|---|---|---|---|
| 4,637,855 A | 1/1987 | Witter et al. ............ 156/616 R |
| 4,661,335 A | 4/1987 | Boudot et al. .............. 423/348 |
| 4,711,660 A | * 12/1987 | Kemp et al. .................. 75/342 |
| 4,756,746 A | * 7/1988 | Kemp et al. .................. 75/342 |
| 4,781,753 A | * 11/1988 | Kopatz et al. ................ 75/342 |
| 4,808,217 A | * 2/1989 | Kopatz et al. ................ 75/342 |
| 4,816,067 A | 3/1989 | Kopatz et al. ............. 75/0.5 B |
| 5,069,740 A | 12/1991 | Levine et al. ............ 156/616.2 |
| 5,124,091 A | * 6/1992 | Paliwal et al. ................ 264/15 |
| 5,128,116 A | 7/1992 | Forwald et al. ............. 423/348 |
| 5,403,439 A | 4/1995 | Matthews ................... 156/662 |
| 5,413,226 A | 5/1995 | Matthews et al. .......... 209/668 |
| 5,817,173 A | 10/1998 | Nakata ........................ 117/73 |

* cited by examiner

*Primary Examiner*—Mary Lynn Theisen
(74) *Attorney, Agent, or Firm*—Robert F. Clark

(57) ABSTRACT

A method for spheridizing silicon metal particles is described. The method involves injecting irregular silicon metal particles into a high-temperature plasma reactor to melt at least 50 weight percent of the particles. The molten droplets are solidified to form substantially spherical silicon particles having a thin SiO coating which may be removed by treating with a weak hydroxide solution.

9 Claims, 2 Drawing Sheets

US 6,780,219 B2

METHOD OF SPHERIDIZING SILICON METAL POWDERS

TECHNICAL FIELD

The present invention relates generally to the silicon metal powders and methods for producing such powders. In particular, this invention relates to methods of making silicon metal powders wherein the silicon particles have a spherical morphology. In another aspect, this invention relates to methods of controlling the surface chemistry of silicon metal powders.

BACKGROUND ART

Silicon metal is produced commercially by carbothermal reduction of silicon oxide in electric furnaces. The molten silicon is tapped from the furnaces and usually cast into the form of large blocks of silicon metal. Silicon powders are then produced by mechanically crushing and grinding the blocks to produce irregularly shaped particles. Silicon powders may also be made directly by atomizing the molten silicon metal tapped from the reduction furnaces as described in U.S. Pat. No. 5,128,116. Silicon metal powders are used in a number of different applications such as semiconductors, solar cells, rocket fuel, high purity alloys and nuclear fuel applications. Many of these applications require one or more of the following properties: high purity, high crystallinity, or a spherical particle morphology.

Spherical silicon particles have been made by a number of processes. For example, in one method, U.S. Pat. No. 4,637,855 describes the fabrication of silicon spheres by heating a slurry of metallurgical grade silicon on the surface of a high temperature substrate. The substrate and the silicon are heated beyond the melting point of silicon causing beads of silicon to appear. These beads form spheres due to the high cohesion of silicon. The spheres are cooled whereupon they crystallize and are removed from the substrate surface.

In another method, U.S. Pat. No. 5,069,740 describes making single crystal silicon spheres by oxidizing the surfaces of silicon particles and then melting the particles to cause impurities to enter into the silicon dioxide skin. The molten particles tend to become more spherical because of surface tension forces. The molten spheres are cooled and then etched with hydrofluoric acid to remove the silicon oxide skin and the impurities contained therein. The steps are then repeated to obtain the desired purity. An intermediate shotting step can be used to form uniform particle sizes.

In yet another method, U.S. Pat. No. 5,817,173, spherical silicon crystals are formed by melting the tips of projections formed integrally on an silicon crystal base.

SUMMARY OF THE INVENTION

It is an object of the invention to obviate the disadvantages of the prior art.

It is another object of the invention to provide a method for making substantially spherical silicon metal particles having a low oxygen content.

It is a further object of the invention to provide a method for spheridizing silicon metal particles at a high rate of throughput.

In accordance with one object the invention, there is provided a method for spheridizing silicon powders comprising:

(a) entraining silicon metal particles having an irregular morphology in a gas stream;

(b) injecting the entrained particles into a plasma reactor containing a reducing atmosphere;

(c) melting at least 50% by weight of the silicon metal particles to form molten droplets; and (d) solidifying the droplets to form substantially spherical silicon metal particles.

In accordance with another object of the invention, the irregular silicon particles are injected into the plasma reactor at a rate of at least about 10 pounds per hour.

In accordance with another object of the invention, the method is capable of making substantially spherical silicon metal particles having an oxygen content less than about 1000 ppm.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

Fine spherical metal powders can be made by high-temperature plasma processing such as described in U.S. Pat. No. 4,816,067 which is incorporated herein by reference. However, it was unknown to apply plasma processing to make spherical silicon metal powders. We have discovered that high-temperature plasma processing can be applied to make a silicon metal powder having particles with a substantially spherical morphology and a low oxygen content.

The method of this invention comprises entraining irregular silicon metal particles in a carrier gas and introducing the entrained particles and carrier gas through a powder port into a high-temperature zone of a plasma reactor. A reducing atmosphere is maintained in the reactor to minimize oxidation of the silicon. The positive pressure in the reactor prevents oxygen from entering and further limits oxidation of the silicon particles. The irregular silicon particles are maintained in the high temperature zone, typically 12,000° C. to 20,000° C., for a sufficient time to melt at least about 50% of the particles by weight. The molten droplets are cooled in an argon-filled receiver upon exiting the plasma to form substantially spherical silicon metal particles. The spheridized particles produced in this way generally have a thin coating of SiO, about 150 nm in thickness, on the surface. The thin SiO surface coating can be at least partially removed by treating the particles with a weak hydroxide solution, preferably a NaOH solution with a pH of from about 8 to about 11. Additionally, the reaction of the hydroxide solution with SiO ($SiO+2NaOH \rightarrow Na_2SiO_3+H_2$) generates $H_2$ which is believed to stabilize the silicon metal particles against further oxidation. The use of a weak hydroxide solution is substantially different from conventional methods which use harsh acids like HF to remove $SiO_2$ coatings from silicon metal particles. Silicon metal is relatively unreactive towards acids but is attacked by alkalis. However, in the method of this invention, a weak hydroxide solution can be used to clean the particle surfaces because only a very thin SiO coating is formed during spheridization. To fully illustrate this invention, the following non-limiting examples are presented.

EXAMPLE 1

Figure 1:
FIG. 1 is a scanning electron micrograph (SEM) of irregular silicon metal particles used as a feed material in the method of this invention.

An argon-hydrogen plasma flame was generated in a PMI plasma gun using an input power of 57.4 kW (700 A, 82 V) and mixed gas flows of 220 scfh argon and 8 scfh hydrogen. Silicon metal powder having an irregular morphology as shown in FIG. 1 and a mean particle size of about 100 micrometers was fed into the plasma gun through a feeder system at a rate of about 10 lb. per hour. Argon at a flow rate of 70 scfh was used as the carrier gas to entrain the particles. The irregularly shaped silicon particles melted in flight and rapidly solidified upon exiting the plasma. The particles were then collected in a hopper under an argon atmosphere. Although the positive pressure in the plasma reactor acts to keep oxygen from entering the reactor, it is very difficult to keep the reactor free of oxygen. Consequently, the spheridized silicon powder contained some large, aggregated $SiO_2$ particles which needed to be removed by sieving with a 60-mesh sieve. More than 99.5 weight percent of the silicon metal particles passed through the 60-mesh sieve.

Figure 2:
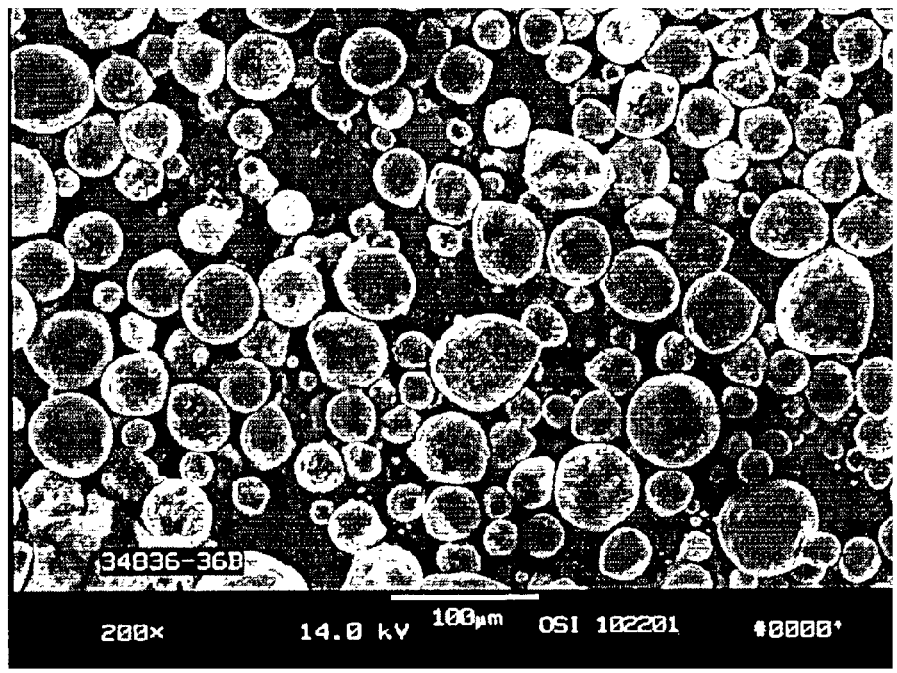
FIG. 2 is an SEM of spheridized silicon metal particles made by the method of this invention before treatment with a weak hydroxide solution.
Figure 3:
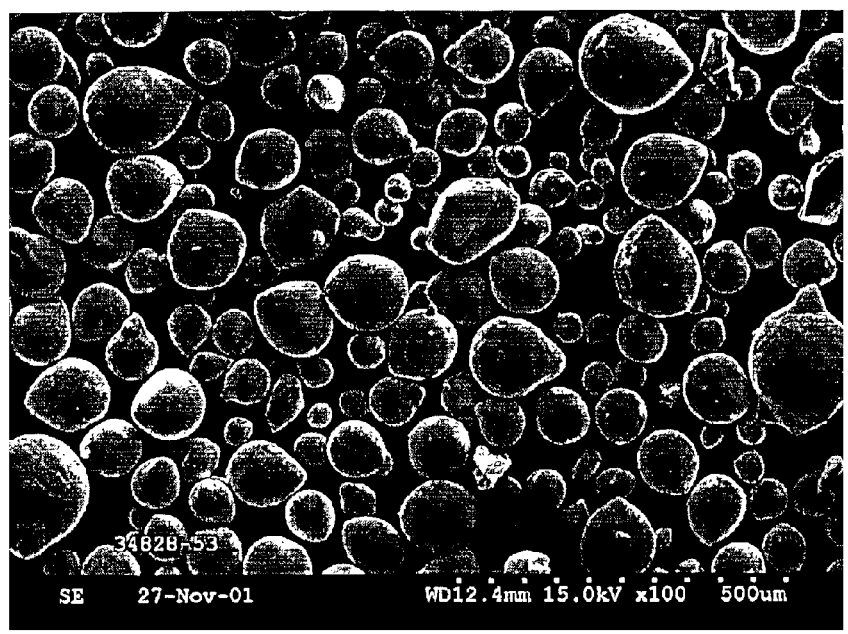
FIG. 3 is an SEM of spheridized silicon metal particles made by the method of this invention after treatment with a weak hydroxide solution.

FIG. 2 is an SEM photomicrograph of the spheridized Si metal particles after sieving. The resulting silicon metal particles had a substantially spherical morphology as shown in FIG. 2 and were covered with a thin coating of SiO. The SiO coating gives the particles a whitish appearance in the SEM photomicrograph. The oxygen content of the powder was 4600 ppm.

EXAMPLE 2

A 400 g amount of the sieved powder from Example 1 was combined with 4 liters of a NaOH solution (pH 10) and agitated for 15 minutes with a mixer. The mixer was stopped, the solids settled and the supernatant was removed. The solids in the bottom of the container were subjected to three 5-minute water rinses. The liquid was removed by decantation after the solids settled. After the final rinse, the solids were separated by filtration and dried at 110° C. The oxygen content of the treated powder was 3000 ppm.

EXAMPLE 3

Using a plasma reactor as in Example 1, approximately 1.6 kg of another batch of spheridized silicon metal powder was prepared. The measured oxygen content in the spheridized powder was 1700 ppm. A 400 g amount of this powder was treated with a NaOH solution (pH 10) as in Example 2. The oxygen content of the powder was reduced to 980 ppm.

EXAMPLE 4

Figure 4:
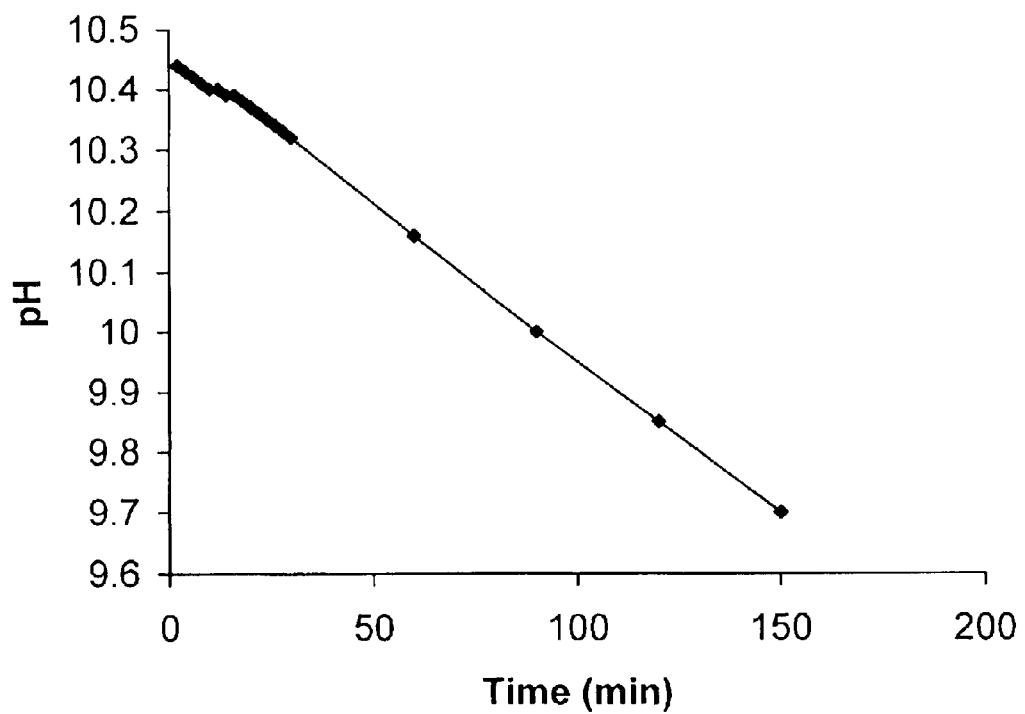
FIG. 4 is a plot showing the variation in the pH of a NaOH solution during removal of the SiO coating on the spheridized silicon metal particles.

In order to further understand the reaction of the NaOH solution with the SiO coating, the time dependence of the solution's pH was studied. As NaOH is consumed according to the reaction $SiO+2NaOH \rightarrow Na_2SiO_3+H_2$, the pH of the solution will decrease. Here, a spheridized Si metal powder containing 3000 ppm oxygen was immersed in a NaOH solution having an initial pH of 10.5. As can be seen in FIG. 4, the reaction proceeded slowly. The results indicate that the removal of oxygen from the surface of the spheridized silicon metal powder can be achieved to low levels by either increasing the time spent in the NaOH solution or by treating the powder with a slightly more concentrated NaOH solution (pH 10.5 to 11 pH). The recovery efficiency of the NaOH-treated powder is about 97%. NaOH solutions having a pH greater than about 11 may increase the loss of silicon.

While there has been shown and described what are at the present considered the preferred embodiments of the invention, it will be obvious to those skilled in the art that various changes and modifications may be made therein without departing from the scope of the invention as defined by the appended claims.

We claim:

1. A method for spheridizing silicon powders comprising:
   (a) entraining silicon metal particles having an irregular morphology in a gas stream;
   (b) injecting the entrained particles into a plasma reactor containing a reducing atmosphere;
   (c) melting at least 50% by weight of the silicon metal particles to form molten droplets;
   (d) solidifying the droplets to form substantially spherical silicon metal particles, the substantially spherical silicon metal particles have a coating of SiO; and
   (e) treating the substantially spherical silicon metal particles with a hydroxide solution.

2. The method of claim 1 wherein the pH of the hydroxide solution is from about 8 to about 11.

3. The method of claim 1 where the reducing atmosphere is a mixture of argon and hydrogen gases.

4. The method of claim 1 wherein the treated particles have an oxygen content less than about 1000 ppm.

5. The method of claim 1 wherein the irregular silicon particles are injected into the plasma reactor at a rate of at least about 10 pounds per hour.

6. A method for spheridizing silicon powders comprising:
   (a) entraining silicon metal particles having an irregular morphology in a gas stream;
   (b) injecting the entrained particles into a plasma reactor containing a reducing atmosphere;
   (c) melting at least 50% by weight of the silicon metal particles to form molten droplets;
   (d) solidifying the droplets to form substantially spherical silicon metal particles;
   (e) treating the substantially spherical silicon metal particles with a sodium hydroxide solution having a pH of from about 8 to about 10.

7. The method of claim 6 wherein the treated particles have an oxygen content less than about 1000 ppm.

8. The method of claim 6 wherein the reducing atmosphere is a mixture of argon and hydrogen.

9. The method of claim 6 wherein the irregular silicon particles are injected into the plasma reactor at a rate of at least about 10 pounds per hour.

* * * * *